(12) United States Patent
Liu et al.

(10) Patent No.: US 9,824,448 B2
(45) Date of Patent: Nov. 21, 2017

(54) METHOD FOR ACQUIRING A MAGNETIC FIELD INHOMOGENEITY VALUE AND DISTORTION CORRECTION METHOD FOR MAGNETIC RESONANCE IMAGING SYSTEM

(71) Applicant: Siemens Healthcare GmbH, Erlangen (DE)

(72) Inventors: Wei Liu, Shenzhen (CN); Kun Zhou, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 22 days.

(21) Appl. No.: 14/945,761

(22) Filed: Nov. 19, 2015

(65) Prior Publication Data

US 2016/0139220 A1 May 19, 2016

(30) Foreign Application Priority Data

Nov. 19, 2014 (CN) .......................... 2014 1 0663071

(51) Int. Cl.
*G01R 33/3875* (2006.01)
*G01R 33/565* (2006.01)
(Continued)

(52) U.S. Cl.
CPC ...... *G06T 7/0028* (2013.01); *G01R 33/56563* (2013.01); *G01R 33/243* (2013.01); *G01R 33/3875* (2013.01); *G01R 33/5616* (2013.01)

(58) Field of Classification Search
CPC ............ G06T 7/0028; G01R 33/56563; G01R 33/243; G01R 33/5616; G01R 33/565; G01R 33/387; G01R 33/3875
See application file for complete search history.

(56) References Cited

U.S. PATENT DOCUMENTS

| 5,485,085 A | * | 1/1996 | Sumanaweera .. G01R 33/56563 324/307 |
| 6,392,412 B1 | * | 5/2002 | Nauerth ........... G01R 33/56563 324/319 |

(Continued)

*Primary Examiner* — Jon Chang
(74) *Attorney, Agent, or Firm* — Schiff Hardin LLP

(57) ABSTRACT

A method for acquiring a basic magnetic field inhomogeneity value of a magnetic resonance imaging (MRI) system includes homogenizing an original basic magnetic field of the MRI system into a target magnetic field, providing a magnetic field compensation amount for the MRI system by a dynamic shimming method. The dynamic shimming method includes performing a 3D low-resolution dual-echo gradient echo sequence, and using a general formula to acquire the magnetic field inhomogeneity value, the general formula being: $\Delta B = \Delta B_{original} + \Delta B_{compensating}$, wherein $\Delta B$ is the magnetic field inhomogeneity value, $\Delta B_{original}$ is a difference value between the original magnetic field and the target magnetic field, and $\Delta B_{compensating}$ is the magnetic field compensation amount. This method for acquiring a magnetic field inhomogeneity value for an MRI system saves considerable time to map the magnetic field again, thereby shortening the magnetic resonance imaging time, and increasing the efficiency of magnetic resonance imaging.

6 Claims, 2 Drawing Sheets

(51) Int. Cl.
  *G06T 7/00*    (2017.01)
  *G01R 33/561*  (2006.01)
  *G01R 33/24*   (2006.01)

(56) References Cited

U.S. PATENT DOCUMENTS

2009/0169083 A1* 7/2009 Li .................... G01R 33/4824
                                              382/131
2009/0195247 A1* 8/2009 Pfeuffer et al. .... G01R 33/5616
                                              324/307
2009/0256567 A1* 10/2009 Aksit ................ G01R 33/243
                                              324/312
2014/0327440 A1* 11/2014 Nakanishi et al. .... A61B 5/055
                                              324/309

* cited by examiner

METHOD FOR ACQUIRING A MAGNETIC FIELD INHOMOGENEITY VALUE AND DISTORTION CORRECTION METHOD FOR MAGNETIC RESONANCE IMAGING SYSTEM

BACKGROUND OF THE INVENTION

Field of the Invention

The present invention concerns the technical field of magnetic resonance imaging, in particular a method for acquiring a magnetic field inhomogeneity value and a distortion correction method for a magnetic resonance imaging system.

Description of the Prior Art

Magnetic resonance imaging (MRI) is a technology in which the phenomenon of magnetic resonance is utilized for the purpose of imaging. The basic principles of magnetic resonance are as follows. When an atomic nucleus contains a single proton, as is the case with the nuclei of the hydrogen atoms that are present throughout the human body, this proton exhibits spin motion and resembles a small magnet. Moreover, the spin axes of these small magnets lack a definite pattern, and if an external magnetic field is applied, the small magnets will be rearranged according to the magnetic force lines of the external field; specifically, they will line up in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis; the atomic nuclei only have a longitudinal magnetization component, which has both a direction and a magnitude. A radio frequency (RF) pulse of a specific frequency is used to excite the atomic nuclei in the external magnetic field such that their spin axes deviate from the positive longitudinal axis or negative longitudinal axis, giving rise to resonance—this is the phenomenon of magnetic resonance. Once the spin axes of the excited atomic nuclei have deviated from the positive or negative longitudinal axis, the atomic nuclei have a transverse magnetization component.

Once emission of the RF pulse has ended, the excited atomic nuclei emit an echo signal, gradually releasing the absorbed energy in the form of electromagnetic waves, such that their phase and energy level both return to the pre-excitation state. An image can be reconstructed by subjecting the echo signal emitted by atomic nuclei to further processing, such as spatial encoding.

Echo Planar Imaging (EPI) is a fast magnetic resonance (MR) imaging method which exhibits geometric distortion. To correct this geometric distortion, a number of distortion correction methods have already been presented in MRI systems in the prior art. These methods are moreover already widely used for distortion correction in (specifically) echo planar imaging and Blood Oxygen Level Dependent Functional Magnetic Resonance Imaging (BOLD fMRI). However, these methods depend on pre-obtained magnetic field charts or point spread functions. Specifically, in applications having long measurement times such as BOLD fMRI or Diffusion Tensor Imaging (DTI), the cost of the time taken to measure a magnetic field chart or point spread function is so small as to be not worth mentioning, but in the case of applications having short measurement times such as Diffusion Weighted Imaging (DWI), additional time cannot be ignored. Specifically, diffusion weighted imaging is based on the method of Echo Planar Imaging (EPI) (a fast MRI method).

SUMMARY OF THE INVENTION

An object of the present invention is to provide a method for acquiring a magnetic field inhomogeneity value for an MRI system. The method according to the invention has the following steps.

In order to homogenize an original basic magnetic field of an MRI system into a target magnetic field, a magnetic field compensation amount for the MRI system is provided by a dynamic shimming method, wherein the dynamic shimming method includes performing a three-dimensional (3D) low-resolution dual-echo gradient echo sequence.

A third general formula is used to acquire the magnetic field inhomogeneity value, the third general formula being:

$$\Delta B = \Delta B_{original} + \Delta B_{compensating},$$

wherein $\Delta B$ is the magnetic field inhomogeneity value, $\Delta B_{original}$ is a difference value between the original magnetic field and the target magnetic field, and $\Delta B_{compensating}$ is the magnetic field compensation amount.

Preferably, a fourth general formula is used to acquire the difference value, the fourth general formula being:

$$\Delta B_{original} = \Delta \phi / (\gamma \cdot \Delta TE),$$

wherein $\Delta TE$ is a difference value of echo times of dual echoes of the 3D low-resolution dual-echo gradient echo sequence, $\Delta \phi$ is a phase difference of two gradient echo images generated by the 3D low-resolution dual-echo gradient echo sequence, and $\gamma$ is a gyromagnetic ratio.

The present invention also provides a distortion correction method for an MRI system that includes the following steps.

Based on magnetic field inhomogeneity values of pixels of a magnetic resonance image obtained in the MRI system by the basic magnetic field of the MRI system, pixel offsets of the pixels in a phase encoding direction are obtained.

The pixel offsets are used to subject the pixels to distortion correction.

Preferably, a first general formula is used to obtain, based on magnetic field inhomogeneity values of pixels of a magnetic resonance image obtained in the MRI system by the basic magnetic field of the MRI system, pixel offsets of the pixels in a phase encoding direction. The first general formula is:

$$\Delta n_{PE} = \alpha \cdot \Delta B + \beta,$$

wherein $\Delta n_{PE}$ is the pixel offsets, $\Delta B$ is magnetic field inhomogeneity values on pixels of a magnetic resonance image obtained in the MRI system by a main magnetic field of the MRI system, $\alpha$ is a conversion parameter, and $\beta$ is an adjustment parameter.

Preferably, the magnetic resonance image is generated by an echo planar imaging method, wherein the conversion parameter is obtained according to a second general formula, the second general formula being:

$$\alpha = \gamma \cdot T_{esp} \cdot N_{PE},$$

wherein $\alpha$ is the conversion parameter, $\gamma$ is a gyromagnetic ratio, $T_{esp}$ is a magnetic resonance echo spacing obtained by the echo planar imaging method, and $N_{PE}$ is the number of steps in the phase encoding direction of the magnetic resonance image.

The present invention also provides an MRI method, including any one of the above methods for acquiring a magnetic field inhomogeneity value and/or any one of the above distortion correction methods.

The present invention further provides a device for acquiring a magnetic field inhomogeneity value for an MRI system, which includes the following components.

A shimming unit composed for shim coil arrangement supplied with current by a shim coil amplifier that is operated by a control computer of a scanner of the magnetic resonance apparatus. The shim coil arrangement is operated to homogenize an original basic magnetic field of the scanner into a target magnetic field by, a magnetic field compensation amount by implementing a dynamic shimming method. The dynamic shimming method includes execution of a 3D low-resolution dual-echo gradient echo sequence.

An acquisition processor uses a third general formula to acquire the magnetic field inhomogeneity value, the third general formula being:

$$\Delta B = \Delta B_{original} + \Delta B_{compensating},$$

wherein $\Delta B$ is the magnetic field inhomogeneity value, $\Delta B_{original}$ is a difference value between the original magnetic field and the target magnetic field, and $\Delta B_{compensating}$ is the magnetic field compensation amount.

Preferably, the acquisition processor is further configured to acquire the difference value using a fourth general formula, the fourth general formula being:

$$\Delta B_{original} = \Delta \phi / (\gamma \cdot \Delta TE),$$

wherein $\Delta TE$ is a difference value of echo times of dual echoes of the 3D low-resolution dual-echo gradient echo sequence, $\Delta \phi$ is a phase difference of two gradient echo images generated by the 3D low-resolution dual-echo gradient echo sequence, and $\gamma$ is a gyromagnetic ratio.

The present invention also provides a distortion correction device for an MRI system that has the following components.

A pixel offset calculation processor that is configured to obtain, based on magnetic field inhomogeneity values of pixels of a magnetic resonance image obtained in the MRI system by a main magnetic field of the scanner of the MRI system, pixel offsets of the pixels in a phase encoding direction.

A correction processor configured to use the pixel offsets to subject the pixels to distortion correction.

Preferably, the pixel offset calculation processor is configured to use a first general formula to obtain, based on magnetic field inhomogeneity values of pixels of a magnetic resonance image obtained in the MRI system by the basic magnetic field of the scanner of the MRI system, pixel offsets of the pixels in a phase encoding direction, the first general formula being:

$$\Delta n_{PE} = \alpha \cdot \Delta B + \beta,$$

wherein $\Delta n_{PE}$ is the pixel offsets, $\Delta B$ is magnetic field inhomogeneity values on pixels of a magnetic resonance image obtained in the MRI system by a main magnetic field of the MRI system, $\alpha$ is a conversion parameter, and $\beta$ is an adjustment parameter.

Preferably, the magnetic resonance image is generated by an echo planar imaging method, wherein the conversion parameter is obtained according to a second general formula, the second general formula being:

$$\alpha = \gamma \cdot T_{esp} \cdot N_{PE},$$

wherein $\alpha$ is the conversion parameter, $\gamma$ is a gyromagnetic ratio, $T_{esp}$ is a magnetic resonance echo spacing obtained by the echo planar imaging method, and $N_{PE}$ is the number of steps in the phase encoding direction of the magnetic resonance image.

The present invention also provides an MRI system that has any one of the above devices for acquiring a magnetic field inhomogeneity value and/or any one of the above distortion correction devices.

It can be seen from the above solution that the method for acquiring a magnetic field inhomogeneity value for an MRI system according to particular embodiments of the present invention can use data generated in a dynamic shimming method directly to calculate magnetic field inhomogeneity, and therefore saves a considerable amount of time taken to map the magnetic field again, thereby shortening the magnetic resonance imaging time, and increasing the efficiency of magnetic resonance imaging. Thus this technology is of great value with regard to the large amount of strenuous scanning work carried out in hospitals.

The distortion correction method for an MRI method according to particular embodiments of the present invention can use magnetic field inhomogeneity values directly to calculate pixel shifts without the need for measurement, and can therefore save substantial time costs in the case of certain MRI methods (such as echo planar imaging methods and Dixon water-fat imaging methods).

DESCRIPTION OF THE PREFERRED EMBODIMENTS

The fundamental feature of the method for acquiring a magnetic field inhomogeneity value for an MRI system according to a particular embodiment of the present invention is the use of magnetic field inhomogeneity values to calculate pixel offsets of pixels of a magnetic resonance image in a phase encoding direction, and the use of the pixel offsets to subject the pixels to distortion correction (i.e. image registration).

Figure 1:
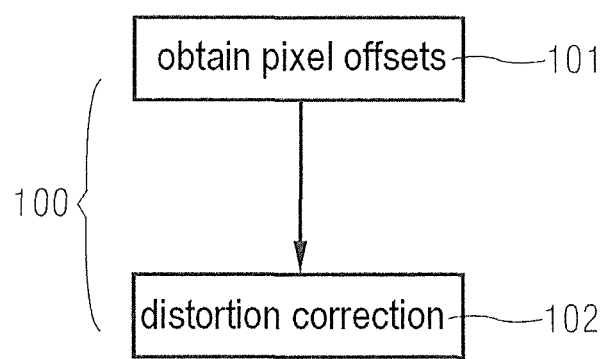
FIG. 1 is a flowchart of a distortion correction method for an MRI system according to a particular embodiment of the present invention.

FIG. 1 is a flowchart of a distortion correction method for an MRI method according to a particular embodiment of the present invention. As FIG. 1 shows, the distortion correction method 100 for an MRI method according to a particular embodiment of the present invention comprises: step 101, based on magnetic field inhomogeneity values on pixels of a magnetic resonance image obtained in the MRI system by the basic magnetic field of the scanner of the MRI system, obtaining pixel offsets of the pixels in a phase encoding direction; and step 102, using the pixel offsets of the pixels to subject the pixels to distortion correction.

Specifically, a step of using a first general formula to obtain, based on magnetic field inhomogeneity values on pixels of a magnetic resonance image obtained in the MRI system by a main magnetic field of the MRI system, pixel offsets of the pixels in a phase encoding direction, the first general formula being:

$$\Delta n_{PE} = \alpha \cdot \Delta B + \beta,$$

wherein $\Delta n_{PE}$ is the pixel offsets of the pixels in a phase encoding direction, $\Delta B$ is magnetic field inhomogeneity values on pixels of a magnetic resonance image obtained in the MRI system by a main magnetic field of the MRI system, α is a conversion parameter, and β is an adjustment parameter. Clearly, there is a linear mapping relationship between magnetic field inhomogeneity values on pixels of a magnetic resonance image obtained in the MRI system by a main magnetic field of the MRI system, and pixel offsets of the pixels in a phase encoding direction.

There is a specific mapping relationship, linear or nonlinear depending on the particular MRI method, between magnetic field inhomogeneity values on pixels of a magnetic resonance image obtained in the MRI system by a main magnetic field of the MRI system, and pixel offsets of the pixels in a phase encoding direction.

Taking an MRI method based on an echo planar imaging (EPI) method as an example, the magnetic resonance image is generated by an echo planar imaging method, wherein the conversion parameter is obtained according to a second general formula, the second general formula being:

$$\alpha = \gamma \cdot T_{esp} \cdot N_{PE},$$

wherein α is the conversion parameter, γ is the gyromagnetic ratio, $T_{esp}$ is a magnetic resonance echo spacing obtained by the echo planar imaging method, $N_{PE}$ is the number of steps in the phase encoding direction of the magnetic resonance image, and the adjustment parameter is a value set by a user or a value calculated by linear fitting. Specifically, in the distortion correction method for an MRI method according to a particular embodiment of the present invention, the adjustment parameter β is 0.

Using the pixel offsets of pixels in a phase encoding direction, obtained in the above step, the pixels in a magnetic resonance image are subjected to distortion correction, i.e. image registration, in subsequent processing; in other words, the original coordinates of pixels in the phase encoding direction are added to the pixel offsets in the phase encoding direction, in order to obtain corrected coordinates of pixels in the phase encoding direction, and in turn obtain a magnetic resonance image formed by the pixels according to the corrected coordinates.

The fundamental feature of the method for acquiring a magnetic field inhomogeneity value for an MRI system according to a particular embodiment of the present invention is: first performing dynamic shimming, then using data generated during dynamic shimming to acquire a magnetic field inhomogeneity value.

Figure 2:
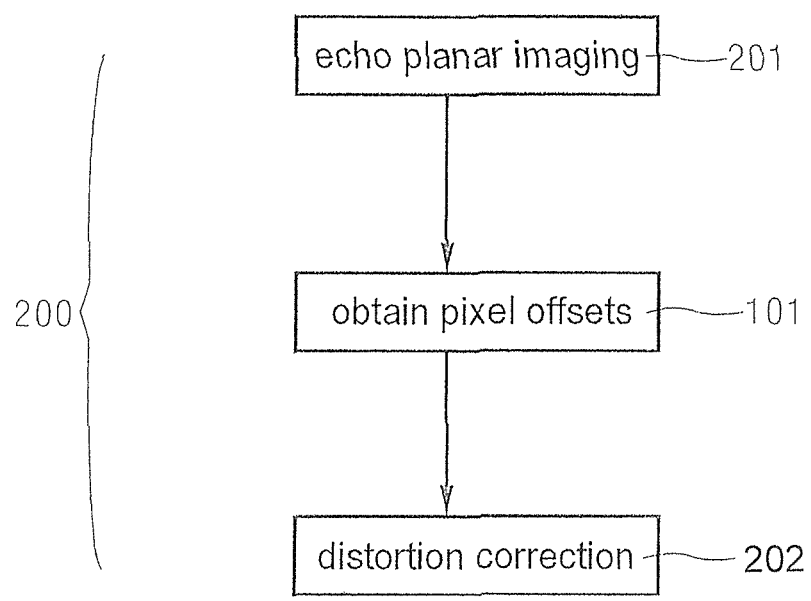
FIG. 2 is a flowchart of a method for acquiring a magnetic field inhomogeneity value for an MRI system according to a particular embodiment of the present invention.

FIG. 2 is a flowchart of a method for acquiring a magnetic field inhomogeneity value for an MRI system according to a particular embodiment of the present invention. As FIG. 2 shows, a method 200 for acquiring a magnetic field inhomogeneity value for an MRI system according to a particular embodiment of the present invention comprises the following steps. In step 201, in order to homogenize an original magnetic field of an MRI system into a target magnetic field, a magnetic field compensation amount is provided for the MRI system by a dynamic shimming method, wherein the dynamic shimming method comprises performing a 3D low-resolution dual-echo gradient echo sequence Step 101 from the embodiment of FIG. 1 is then implemented, followed by step 202, which is comparable to step 102 of FIG. 1, but wherein a third general formula is used to acquire the magnetic field inhomogeneity value, the third general formula being:

$$\Delta B = \Delta B_{original} + \Delta B_{compensating}$$

wherein ΔB is the magnetic field inhomogeneity value, $\Delta B_{original}$ is the difference value between the original magnetic field and the target magnetic field, and $\Delta B_{compensating}$ is the magnetic field compensation amount.

Specifically, the MRI system makes use of a dynamic shimming method to improve magnetic field homogeneity, in other words to homogenize the original magnetic field of the MRI system into a target magnetic field. In the dynamic shimming method, a magnetic field compensation amount is superposed on the original basic magnetic field, so as to form a shimmed actual magnetic field. The magnetic field inhomogeneity value is just the difference value between the target magnetic field and the actual magnetic field; at the same time, the magnetic inhomogeneity value is also just the sum of the magnetic field compensation amount and the difference between the original magnetic field and the target magnetic field.

Specifically, a fourth general formula is used to acquire the difference value, the fourth general formula being:

$$\Delta B_{original} = \Delta \phi / (\gamma \cdot \Delta TE),$$

wherein ΔTE is a difference value of echo times of dual echoes of the 3D low-resolution dual-echo gradient echo sequence, Δφ is a phase difference of two gradient echo images generated by the 3D low-resolution dual-echo gradient echo sequence, and γ is the gyromagnetic ratio. At the same time, $\Delta B_{original}$ is the difference value between the original magnetic field and the target magnetic field and can be obtained in various other ways, such as be measurement, etc.

Specifically, a fifth general formula is used to acquire the difference value, the fifth general formula being:

$$B_{compensating}(r, \theta, \phi) = \sum_{n=0}^{\infty} \sum_{m=0}^{n} \left(\frac{r}{R_0}\right)^n (A_n^m I_n^m \cos(m\phi) + B_n^m I_n^m \sin(m\phi)) P_n^m (\cos\theta)$$

The fifth general formula describes the situation in a spherical coordinate system, wherein (r, θ, φ) are coordinates in the spherical coordinate system; due to the presence of multiple shimming coils, (m,n) is used to distinguish each shimming coil; $R_0$ denotes the radius of a shimming region; $A_n^m$ and $B_n^m$ denote the sensitivity of the (m,n)th shimming coil; $I_n^m$ denotes the size of the current passing into the (m,n)th coil; $P_n^m$ is a Legendre polynomial. $R_0$, $A_n^m$, $B_n^m$ and $I_n^m$ can all be acquired from the MRI system. Generally, $R_0$, $A_n^m$ and $B_n^m$ are related to the system hardware, and will not vary; $I_n^m$ is calculated by dynamic shimming technology according to $\Delta B_{original}$ and will vary with the scanned object.

In a dynamic shimming method, a magnetic field measurement sequence, i.e. the 3D low-resolution dual-echo gradient echo sequence, acquires 3D volume data of a region to be shimmed, for the purpose of assessing a shimming current needed in each shimming coil so as to optimize magnetic field homogeneity.

The method for acquiring a magnetic field inhomogeneity value for an MRI system according to particular embodiments of the present invention can use data generated in a dynamic shimming method directly to calculate magnetic field inhomogeneity, and therefore saves the considerable amount of time taken to map the magnetic field again, thereby shortening the magnetic resonance imaging time, and increasing the efficiency of magnetic resonance imaging. Thus this technology is of great value with regard to the large amount of strenuous scanning work carried out in hospitals.

The distortion correction method for an MRI method according to particular embodiments of the present invention can use magnetic field inhomogeneity values directly to calculate pixel shifts without the need for measurement, and can therefore save substantial time costs in the case of certain MRI methods (such as echo planar imaging methods and Dixon water-fat imaging methods).

Specifically, taking echo planar imaging methods and Dixon water-fat imaging methods as an example: these use a dual-echo sequence based on a gradient echo to map an original magnetic field; shimming is then performed based on the original magnetic field, i.e. in order to turn the main magnetic field of the magnetic resonance system into a homogeneous magnetic field (i.e. target magnetic field); an actual magnetic field is generated by superposing a compensating magnetic field on the original magnetic field (but a disparity remains between the actual magnetic field and the target magnetic field; for example, a shimming operation comprises various methods, e.g. static shimming methods and dynamic shimming methods, wherein a dynamic shimming method uses a shimming current to generate a compensating magnetic field. Thus, the vector sum of the original magnetic field and compensating magnetic field forms the actual magnetic field, and then the difference between the target magnetic field and actual magnetic field forms the magnetic field inhomogeneity value. In the distortion correction method for an MRI method according to particular embodiments of the present invention, the magnetic field inhomogeneity value is used to calculate pixel offsets, and therefore saves the considerable amount of time taken to map the magnetic field again, thereby shortening the magnetic resonance imaging time, and increasing the efficiency of magnetic resonance imaging. Thus this technology is of great value with regard to the large amount of strenuous scanning work carried out in hospitals.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring a magnetic field inhomogeneity value of a magnetic resonance imaging (MRI) system, comprising:

homogenizing an original basic magnetic field of a magnetic resonance scanner into a target magnetic field, by providing a magnetic field compensation amount for the scanner by a dynamic shimming method executed in a processor, wherein the dynamic shimming method comprises performing a three-dimensional (3D) low-resolution dual-echo gradient echo sequence;

in said processor, using a general formula to acquire the magnetic field inhomogeneity value, the general formula being $$\Delta B = \Delta B_{original} + \Delta B_{compensating},$$

wherein $\Delta B$ is the magnetic field inhomogeneity value, $\Delta B_{original}$ is a difference value between the original basic magnetic field and the target magnetic field, and $\Delta B_{compensating}$ is the magnetic field compensation amount;

using a further general formula to acquire the difference value, the further general formula being:

$$\Delta B_{original} = \Delta\phi/(\gamma \cdot \Delta TE),$$

wherein $\Delta TE$ is a difference value of echo times of dual echoes of the 3D low-resolution dual-echo gradient echo sequence, $\Delta\phi$ is a phase difference of two gradient echo images generated by the 3D low-resolution dual-echo gradient echo sequence, and $\gamma$ is a gyromagnetic ratio; and making the magnetic field inhomogeneity value available from the processor as an electronic signal.

2. A distortion correction method for a magnetic resonance imaging (MRI) system, comprising:

based on magnetic field inhomogeneity values of pixels of a magnetic resonance image obtained in the MRI system using a basic magnetic field of the MRI system, obtaining, in a processor, pixel offsets of the pixels in a phase encoding direction;

using the pixel offsets to subject the pixels to distortion correction in said processor;

using a general formula $$\Delta n_{PE} = \alpha \cdot \Delta B + \beta,$$

wherein $\Delta n_{PE}$ is the pixel offsets, $\Delta B$ is magnetic field inhomogeneity values on pixels of a magnetic resonance image obtained in the MRI system by a main magnetic field of the MRI system, $\alpha$ is a conversion parameter, and $\beta$ is an adjustment parameter; and making the distortion-corrected pixels available from the processor in electronic form as a data file.

3. The distortion correction method as claimed in claim 2, comprising operating the scanner of the magnetic resonance system with an echo planar imaging method, and obtaining the conversion parameter according to a further general formula, the further general formula being:

$$\alpha = \gamma \cdot T_{esp} \cdot N_{PE},$$

wherein $\alpha$ is the conversion parameter, $\gamma$ is a gyromagnetic ratio, $T_{esp}$ is a magnetic resonance echo spacing obtained by the echo planar imaging method, and $N_{PE}$ is the number of steps in the phase encoding direction in the magnetic resonance scanner.

4. A device for acquiring a magnetic field inhomogeneity value for a magnetic resonance imaging apparatus comprising:

a processor configured to homogenize an original basic magnetic field of a magnetic resonance scanner into a target magnetic field, by providing a magnetic field compensation amount for the scanner by a dynamic shimming method executed in a processor, wherein the dynamic shimming method comprises performing a three-dimensional (3D) low-resolution dual-echo gradient echo sequence;

said processor being configured to use a general formula to acquire the magnetic field inhomogeneity value, the general formula being $$\Delta B = \Delta B_{original} + \Delta B_{compensating},$$

wherein $\Delta B$ is the magnetic field inhomogeneity value, $\Delta B_{original}$ is a difference value between the original basic magnetic field and the target magnetic field, and $\Delta B_{compensating}$ is the magnetic field compensation amount;

using a further general formula to acquire the difference value, the further general formula being:

$$\Delta B_{original} = \Delta\phi/(\gamma \cdot \Delta TE),$$

wherein $\Delta TE$ is a difference value of echo times of dual echoes of the 3D low-resolution dual-echo gradient echo sequence, $\Delta\phi$ is a phase difference of two gradient echo images generated by the 3D low-resolution dual-echo gradient echo sequence, and $\gamma$ is a gyromagnetic ratio; and said processor being configured to make the magnetic field inhomogeneity value available from the processor as an electronic signal.

5. A distortion correction device for a magnetic resonance imaging (MRI) system comprising:

a processor configured to obtain pixel offsets of pixels in a phase encoding direction based on magnetic field inhomogeneity values of pixels of a magnetic resonance image obtained in the MRI system using a basic magnetic field of the MRI system;

said processor being configured to use the pixel offsets to subject the pixels to distortion correction in said processor;

using a the general formula $$\alpha n_{PE} = \alpha \cdot \Delta B + \beta,$$

wherein $\Delta n_{PE}$ is the pixel offsets, $\Delta B$ is magnetic field inhomogeneity values on pixels of a magnetic resonance image obtained in the MRI system by a main magnetic field of the MRI system, $\alpha$ is a conversion parameter, and $\beta$ is an adjustment parameter; and said processor being configured to make the distortion-corrected pixels available from the processor in electronic form as a data file.

6. The distortion correction device as claimed in claim 5, wherein the processor is configured to operate the scanner of the MRI system with an echo planar imaging method, and to obtain the conversion parameter according to a further general formula, the further general formula being:

$$\alpha = \gamma \cdot T_{esp} \cdot N_{PE},$$

wherein $\alpha$ is the conversion parameter, $\gamma$ is a gyromagnetic ratio, $T_{esp}$, is a magnetic resonance echo spacing obtained by the echo planar imaging method, and $N_{PE}$ is the number of steps in the phase encoding direction in the magnetic resonance scanner.

* * * * *